United States Patent
Harris

(10) Patent No.: US 7,745,851 B2
(45) Date of Patent: Jun. 29, 2010

(54) POLYTYPE HETERO-INTERFACE HIGH ELECTRON MOBILITY DEVICE AND METHOD OF MAKING

(75) Inventor: Christopher Harris, Taby (SE)

(73) Assignee: Cree, Inc., Durham, NC (US)

( * ) Notice: Subject to any disclaimer, the term of this patent is extended or adjusted under 35 U.S.C. 154(b) by 389 days.

(21) Appl. No.: 11/783,958

(22) Filed: Apr. 13, 2007

(65) Prior Publication Data
US 2007/0243674 A1 Oct. 18, 2007

Related U.S. Application Data

(60) Provisional application No. 60/791,459, filed on Apr. 13, 2006.

(51) Int. Cl.
*H01L 29/778* (2006.01)

(52) U.S. Cl. .......... 257/194; 257/183; 257/192

(58) Field of Classification Search .......... 257/77, 257/263, 135, 232, 20, 187, 194; 438/39, 438/149, 186, 478, 570, 767, 164, 412
See application file for complete search history.

(56) References Cited

U.S. PATENT DOCUMENTS 7,119,380 B2 * 10/2006 Sankin et al. .......... 257/135
7,345,309 B2 * 3/2008 Zhang et al. .......... 257/77

* cited by examiner

*Primary Examiner*—Thanh V Pham
*Assistant Examiner*—Errol Fernandes
(74) *Attorney, Agent, or Firm*—Volentine & Whitt, P.L.L.C.

(57) ABSTRACT

A high electron mobility device and method of making is provided whereby a two-dimensional electron gas is formed at a hetero-junction or hetero-interface between different polytypes of a semiconductor material. The different crystal forms or polytypes of the semiconductor material having different electronic bandgaps are used to provide the bandgap necessary to form the two-dimensional electron gas.

11 Claims, 7 Drawing Sheets

POLYTYPE HETERO-INTERFACE HIGH ELECTRON MOBILITY DEVICE AND METHOD OF MAKING

CROSS REFERENCE TO RELATED APPLICATIONS

The present application claims the benefit of priority under 35 U.S.C. 119(e)(1) to U.S. Provisional Patent Application No. 60/791,459 entitled "HIGH ELECTRON MOBILITY TRANSISTOR IN SiC", filed Apr. 13, 2006, which is hereby incorporated by reference in its entirety for all purposes.

BACKGROUND OF THE INVENTION

1. Field of the Invention

The present invention relates to a high electron mobility device having a two-dimensional electron gas (2DEG) formed at a hetero-interface of different polytypes of a semiconductor material, and the method of making such a high electron mobility device.

2. Background

High electron mobility transistors (HEMTs) demonstrate the ability to operate at very high frequencies. By using two different materials having different respective bandgaps, charge may be confined to the interface between the two different materials to thus form a two-dimensional electron gas (2DEG) that realizes high mobility in the direction of current flow along the 2DEG. Typically, a HEMT structure includes a 2DEG formed at the interface between an indium gallium arsenide layer and a gallium arsenide layer, a so called InGaAs/GaAs system. Another example of a typical HEMT structure includes a 2DEG formed at the interface between a gallium arsenide layer and an aluminum gallium arsenide layer, a so called GaAs/AlGaAs system.

Silicon carbide (SiC) is an attractive material for high-frequency power applications. However, in the case of silicon carbide, it is not possible to form a ternary alloy that allows the bandgap of the material to be engineered or changed in order to create a SiC heterojunction with a band-offset in either the conduction or valence band. In other words, there are no elements that can conveniently be added to SiC to change the bandgap of the material in a suitable manner as necessary to form a 2DEG.

In SiC, the bandgap of the material is dependent upon the crystal type in which the atoms are arranged. By combining two crystal polytypes, a heterojunction can be formed at the interface between the two. However, the growth of two polytypes in contact, whereby both crystals are of high quality and form a single domain, is a significant challenge. Accordingly, there is a need to provide a SiC high electron mobility device, and in general to provide high electron mobility devices for materials that have no suitable ternary alloys, whereby high quality crystal polytypes are used to form a hetero-junction.

SUMMARY OF THE INVENTION

In accordance with an embodiment, a method of manufacturing a high electron mobility device includes in combination growing a first layer of a first polytype of semiconductor material on a substrate, the first layer being on off-axis layer; etching the first layer to form a narrow mesa region of the first polytype that extends from a main surface of the first layer; regrowing the semiconductor material over the narrow mesa region, to form a regrown layer of the first polytype that has an on-axis surface over a top surface of the narrow mesa region; and growing a second layer of a second polytype of the semiconductor material on the regrown layer, to form a hetero-interface between the regrown layer and the second layer over the top surface of the narrow mesa region, wherein the second layer is substantially a single crystal domain of the second polytype over the top surface of the narrow mesa region.

In accordance with another embodiment, a method of manufacturing a high mobility device includes in combination growing a first layer of a first polytype of semiconductor material on a substrate, the first layer being an off-axis layer; implanting a source region and a drain region into the first layer of the semiconductor material, the source region and the drain region separated from each other by a channel region; forming a mask on the first layer, the mask covering the source and drain regions and exposing the channel region; growing a second layer of a second polytype of the semiconductor material on the channel region using the mask, to form a hetero-interface between the first and second layers along the channel region, the second layer on the channel region is substantially a single crystal domain region of the second polytype; and removing the mask.

In accordance with a further embodiment, a high electron mobility device includes in combination a substrate of semiconductor material; a first layer of a first polytype of the semiconductor material on the substrate, the first layer being an off-axis layer and having a narrow mesa region that extends from a first main surface of the first layer; a regrown layer of the first polytype over the narrow mesa region, the regrown layer having an on-axis surface over a top surface of the narrow mesa region; a source region in the regrown layer over a first sidewall of the narrow mesa region; a drain region in the regrown layer over a second sidewall of the narrow mesa region; and a second layer of a second polytype of the semiconductor material on the regrown layer, wherein a hetero-interface is formed between the regrown layer and the second layer over the top surface of the narrow mesa region, wherein the second layer is substantially a single crystal domain of the second polytype over the top surface of the narrow mesa region.

In accordance with a still further embodiment, a high electron mobility device includes in combination a substrate of a semiconductor material; a first layer of a first polytype of the semiconductor material on the substrate, the first layer being an off-axis layer; a source region and a drain region in a surface of the first layer, the source region and the drain region separated from each other; and a second layer of a second polytype of the second material on a channel region of the first layer between the source region and the drain region, wherein a hetero-interface is formed between the first layer and the second layer, wherein the second layer on the channel region is substantially a single crystal domain region of the second polytype.

BRIEF DESCRIPTION OF THE DRAWINGS

The above and other objects and features of the present invention will become apparent from the following description of the preferred embodiments made in conjunction with the accompanying drawings, in which.

DETAILED DESCRIPTION OF THE PREFERRED EMBODIMENT

Figure 1:
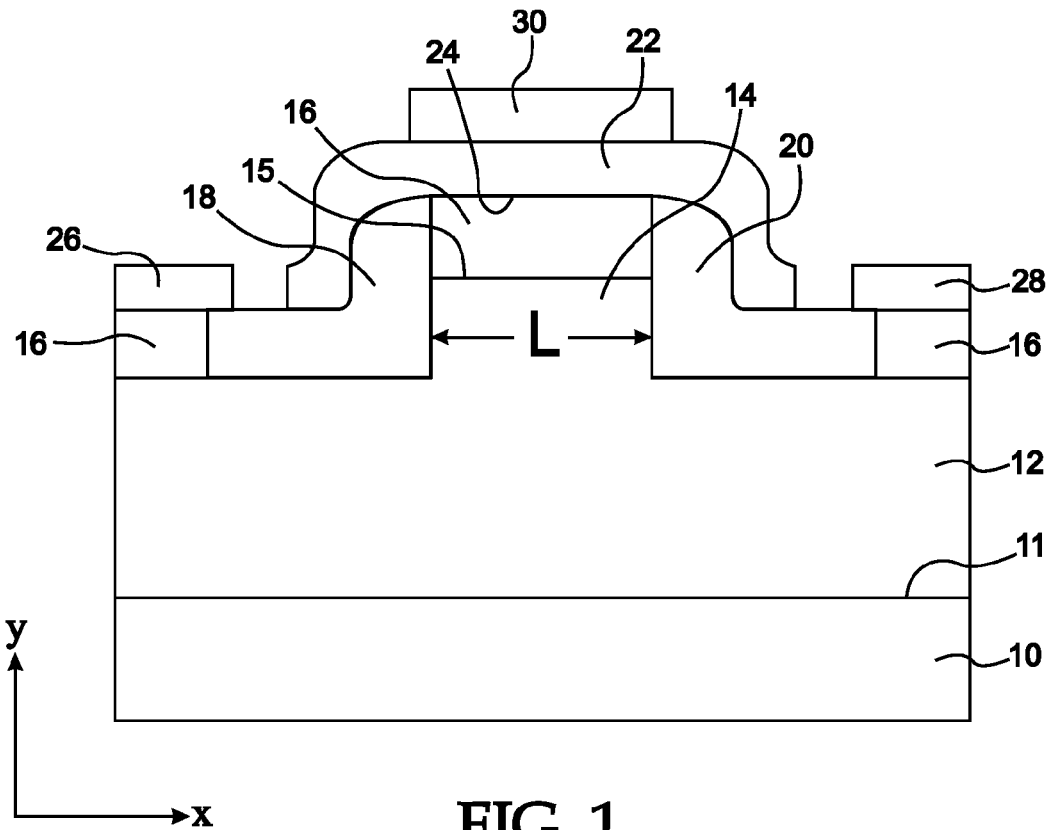
FIG. 1 illustrates a cross-section of a high electron mobility device of a first embodiment.

The present invention will now be described more fully hereinafter with reference to the accompanying drawings, in which preferred embodiments of the invention are shown. This invention may however be embodied in many different forms and should not be construed as limited to the embodiments set forth herein. Rather, the embodiments as described are provided so that this disclosure will be thorough and complete, and will fully convey the concept of the invention to those skilled in the art. In the drawings, the shapes of elements are exaggerated for clarity, and are not necessarily drawn to scale, and like reference numerals are used to refer to like elements throughout the application.

In general, for high electron mobility transistor (HEMTs), InGaAs/GaAs or GaAs/AlGaAs systems are used to form a two-dimensional electron gas (2DEG) at the interface of the heterojunction between the materials. As noted above, suitable ternary alloys are not available for some compounds such as silicon carbide (SiC). In the embodiments of this application, the HEMT devices are formed by so called polytype heterojunctions or hetero-interfaces of a same semiconductor material. Different crystal forms or polytypes of a semiconductor material having different electronic band structures are used to thus provide the bandgap necessary to form a 2DEG at an interface of the two different polytypes of the semiconductor materials. A benefit of this approach is that the different polytypes of the semiconductor material maintain relatively close lattice matching. The crystals of the different polytypes thus fit together with minimal defects.

FIG. 1 illustrates a cross-section of a high electron mobility device of an embodiment of the application. In this embodiment, a silicon carbide high electron mobility transistor (HEMT) is described, wherein a 2DEG is formed at a polytype hetero-interface of the structure. It should however be understood that this embodiment is not necessarily limited to silicon carbide, but may be applicable to other semiconductor materials such as the cubic and hexagonal forms of GaN. Moreover, it should be readily understood in view of the following description that the principals of this invention may also be contemplated as applicable to devices such as Heterojunction Bipolar Transistors (HBTs). Thus, the following should not be construed as limited to the device structures as described.

As illustrated in FIG. 1, the high electron mobility device includes a silicon carbide substrate 10 that is an off-axis substrate. As should be understood by one of ordinary skill, an off-axis substrate does not have a perfectly flat surface. Substrate 10 is made from a wafer of silicon carbide that is cut and polished so as to be stepped, or in other words to have steps or terraces on the surface thereof. Accordingly, although not particularly illustrated in FIG. 1 for the sake of simplicity, the upper surface 11 of off-axis silicon carbide substrate 10 is stepped. For example, substrate 10 may have a thickness in a range of about 400 micrometers, and each step may extend upward from a base level a height in a range of about 2 nm. The steps or terraces of the off-axis substrate 10 provide well-defined starting points for subsequent epitaxial growth of the same polytype as the substrate, for example 4H (hexagonal) or 6H, reducing the occurrence of random nucleation during growth, and thus providing high quality crystal growth.

As further illustrated in FIG. 1, a first layer 12 of high quality silicon carbide of a first polytype is grown on upper surface 11 of substrate 10. In this embodiment, the first polytype is high-quality 4H or 6H polytype that is an off-axis layer. It should be understood however that first layer 12 should not necessarily be limited as 4H or 6H polytype.

It should also be understood that in general, the crystal of an existing layer of semiconductor material of a given polytype serves as a template for subsequent crystal growth, so that there is a tendency for the same given polytype to grow on the underlying crystal. In order to grow a different polytype on an underlying crystal, it is thus necessary to overcome the desire of the crystal to continue to grow the same polytype. However, it is known that the 3C (cubic) polytype of silicon carbide is the polytype most favorable for low-temperature growth. That is, crystal growth will predominantly be 3C polytype at low temperatures in a range of about 1200°-1400° C. Also, if high quality 3C polytype is to be grown on 4H polytype, it is preferable that the 4H polytype is not an off-axis layer, because off-axis 4H polytype would encourage the growth of 4H polytype thereon. Accordingly, as an aspect of this embodiment, it is necessary to provide an initial off-axis substrate to grow high-quality 4H polytype, and to then subsequently create regions of 4H polytype that are not off-axis regions, so as to favorably grow single domain 3C polytype thereon.

Returning to FIG. 1, first layer 12 which is an off-axis region of 4H or 6H polytype, includes a narrow mesa region 14 that extends upward in the y-direction. Narrow mesa region 14 may be formed by etching first layer 12 as will be subsequently described, and may have a height in the y-direction from the upper surface of first layer 12 in a range of about 0.5 micrometers and a length L along the x-direction in a range of about 10 microns or less, or about 5 microns, or more particularly about 3-4 microns. Narrow mesa region 14 helps to define the channel region of the device between source 18 and drain 20.

In greater detail, the length L of narrow mesa region 14 in FIG. 1 is selected as noted above, so that during a subsequent short, high temperature regrowth of the first polytype on upper surface 15 of narrow mesa region 14, a regrown layer 16 that is predominantly on-axis will be formed. The thickness of regrown layer 16 from upper surface 15 of narrow mesa region 14 along the y-direction may be in a range of about 0.5 micrometers. Accordingly, by limiting the mesa width L and conducting a high temperature regrowth process, regrown layer 16 is formed as an on-axis surface of 4H or 6H polytype, which is suitable for growth of on-axis 3C polytype thereon. As noted previously, an off-axis surface of the 4H polytype would encourage the growth of 4H polytype thereon.

As further illustrated in FIG. 1, source 18 and drain 20 are implanted within regrown layer 16 along the sidewalls of the mesa structure, and within regrown layer 16 over the upper surface of first layer 12. Also, second layer 22 is grown on an upper surface of regrown layer 16 above top or upper surface 15 of narrow mesa region 14 and along the sidewalls of the mesa structure. In this embodiment, second layer 22 can be grown at low temperature as a 3C polytype. A hetero-interface 24 is formed at an interface between regrown layer 16 and second layer 22. Because mesa width L is selected or limited as previously noted, second layer 22 is substantially a single crystal domain of 3C polytype at hetero-interface 24. Finally, the device structure includes metal contacts 26, 28 and 30 respectively on source 18, drain 20 and second layer 22. Metal contacts 26, 28 and 30 may be Ni, for example.

For purposes of explanation, "substantially a single domain of crystal" should be understood to mean that second layer 22 of the 3C polytype is a single crystal that grows from a single nucleation site. That is, the intent is to control or limit mesa width L realized at the top surface of regrown layer 16, to thus consequently control or limit the length L of second layer 22 at hetero-interface 24, so that crystal growth of the 3C polytype of second layer 22 does not start at a large number or plurality of nucleation sites. Smaller mesa width L increases the probability of obtaining a single domain of crystal growth. The scope of "substantially a single domain of crystal" should however also include a layer in which growth of a single domain from a single nucleation site is intended, but which inadvertently includes second or third domains grown from additional nucleation sites. This is in contrast to and dramatically different than growing a 3C polytype on a non-confined area wherein a large plurality of many crystal domains from corresponding nucleation sites are grown. The purpose behind limiting the 3C polytype in this embodiment as substantially a single domain of crystal, is to reduce grain boundary conduction and thus limit electron leakage. This enables improved performance of the two-dimensional electron gas formed at the hetero-interface 24 between second layer 22 and regrown layer 16.

Figure 2:
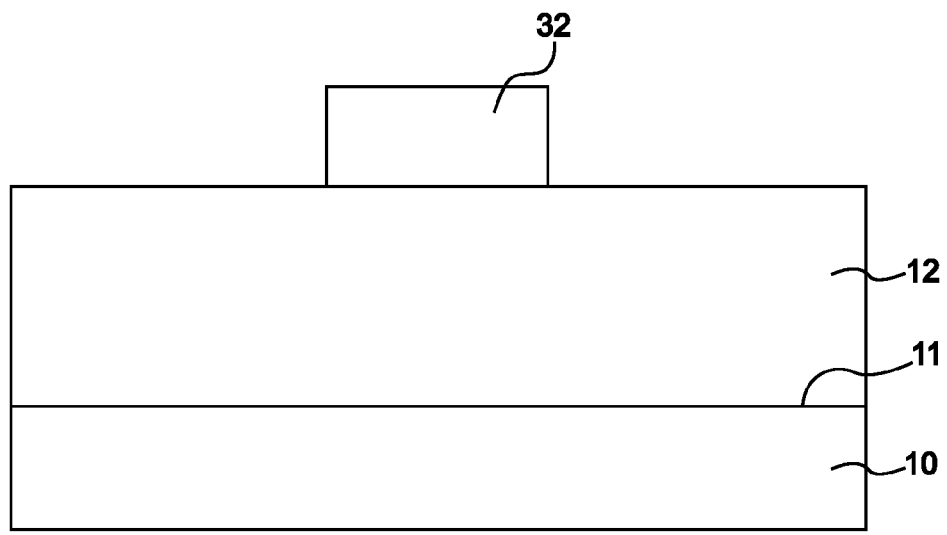
FIGS. 2-9 illustrate cross-sectional views descriptive of a process of making the device of FIG. 1.

A process of making the device of FIG. 1 will now be described with reference to FIGS. 2-9. As shown in FIG. 2, a first layer 12 of off-axis, high quality 4H or 6H polytype is grown on upper surface 11 of off-axis silicon carbide substrate 10. First layer 12 may have a thickness in a range of about 1 to 5 micrometers and is grown at a temperature above 1500° C. under standard conditions for the growth of non-cubic SiC. A mask 32 is formed on the upper surface of first layer 12. Mask 32 may be silicon dioxide or photoresist, and may be formed by well known patterning and photolithographic techniques.

Figure 3:
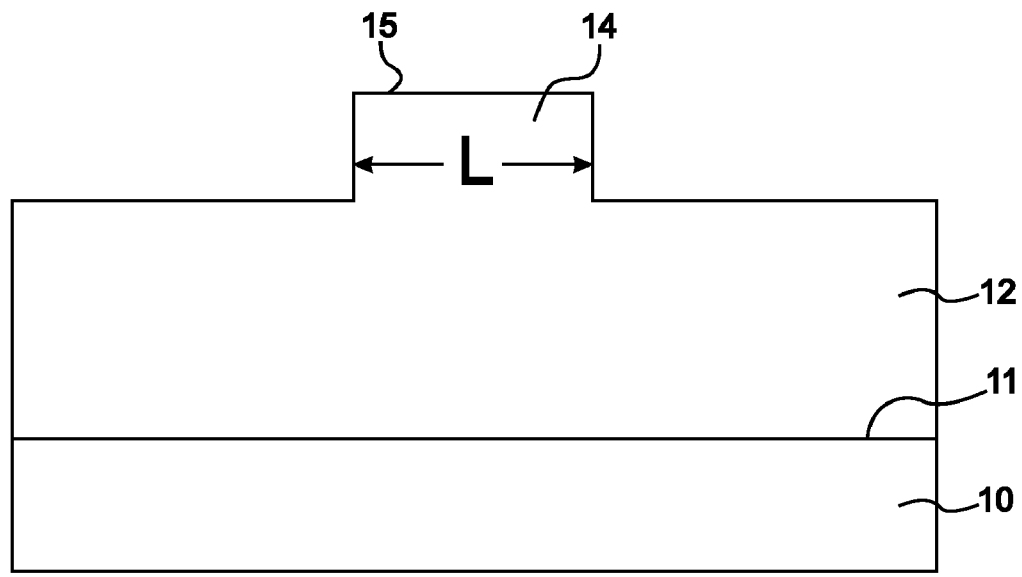

With reference to FIG. 3, the narrow mesa region 14 is formed by etching first layer 12 using mask 32. Typical Reactive Ion Etch (RIE) parameters and etch gases such $SF_6$, $CF_4$ etc., may be used.

Figure 4:
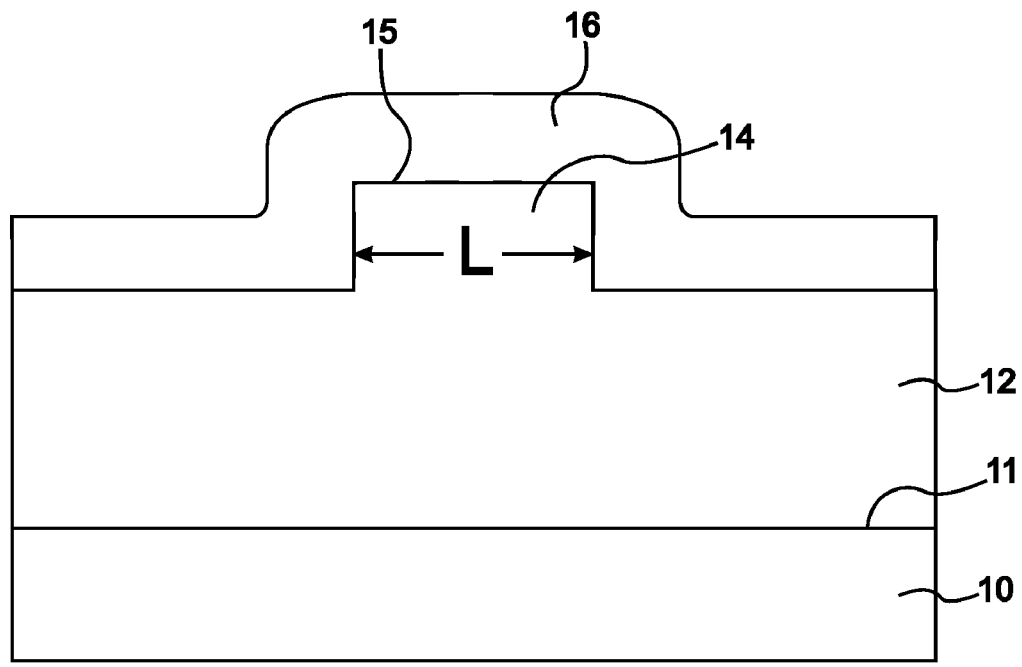

With reference to FIG. 4, the regrown layer 16 of 4H or 6H polytype that forms an on-axis surface on the mesa top is subsequently regrown on the upper surface of the structure including the top surface 15 and sidewalls of narrow mesa region 14, and on the surfaces of first layer 12 at locations peripheral of narrow mesa region 14. The layer is grown at a temperature above 1500° C. under standard conditions for the growth of non-cubic SiC.

Figure 5:
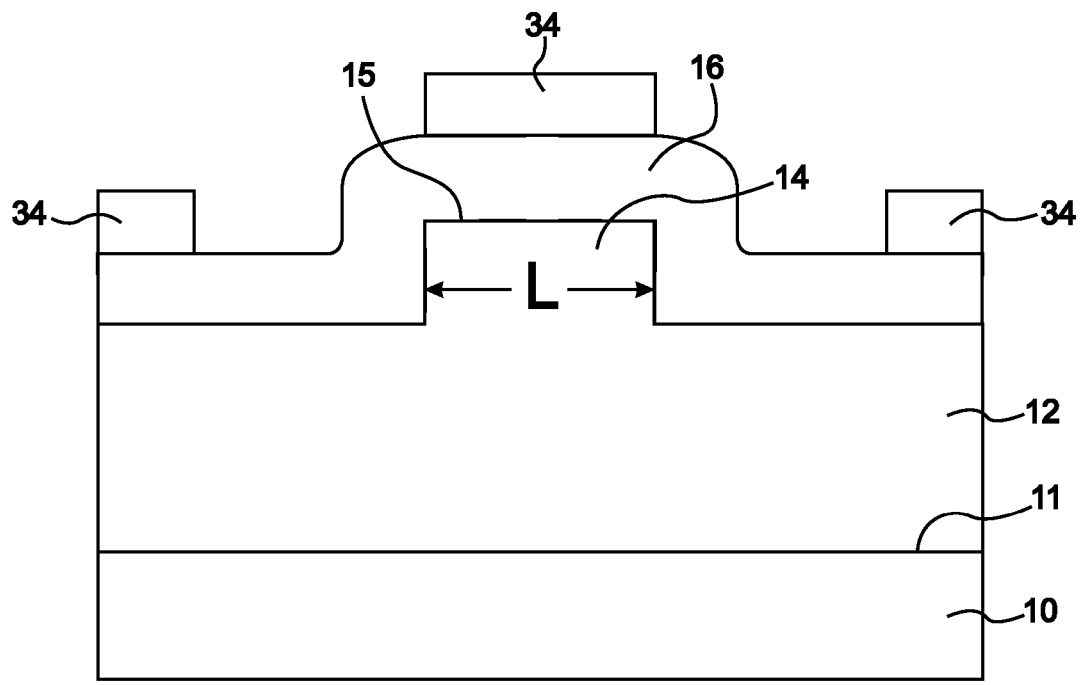

With reference to FIG. 5, source and drain ion implantation is subsequently carried out. As shown in FIG. 5, mask 34 is formed on regrown layer 16 using standard patterning and photolithographic techniques, so as to be over top surface 15 of narrow mesa region 14. Mask 34 is also formed on regrown layer 16 over the upper surface of first layer 12, at locations peripheral of narrow mesa region 14. Mask 34 may be silicon dioxide or silicon nitride, and over top surface 15 of narrow mesa region 14 has similar dimensions and location as mask 32 described with respect to FIG. 2. The regrown layer 16 on the sidewalls of narrow mesa region 14 and on the upper surface of first layer 12 at locations adjacent narrow mesa region 14 are not covered by mask 34.

Figure 6:
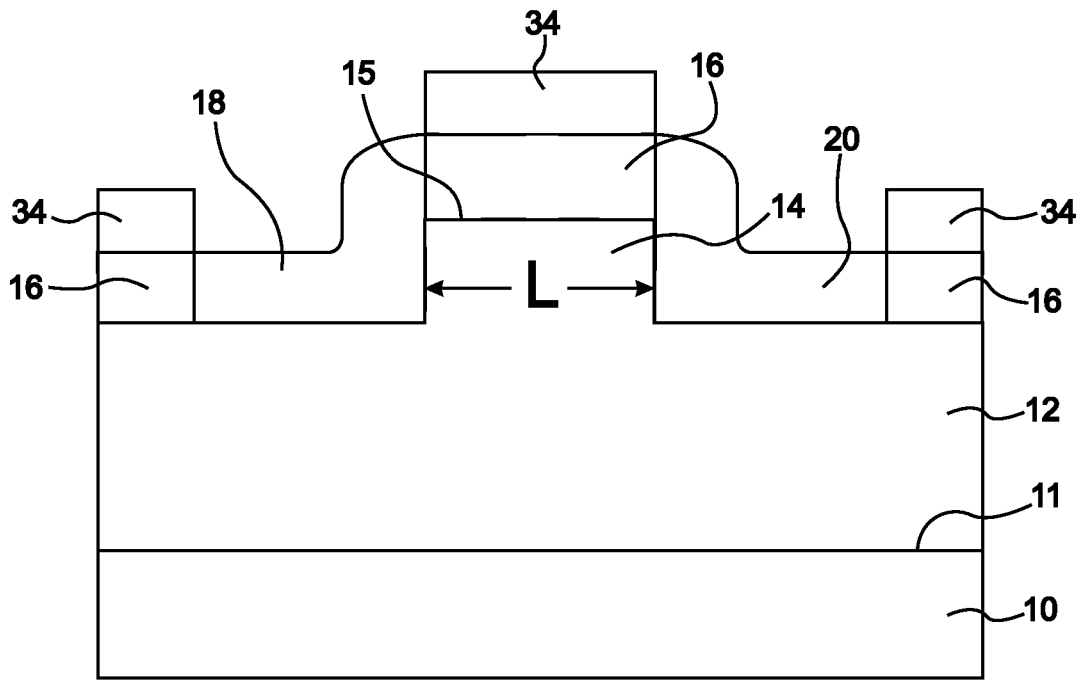

Thereafter, as described with respect to FIG. 6, tilt ion implantation is carried out in a well known manner using mask 34, to implant impurities such as nitrogen or phosphorus (or aluminum if a hole gas is formed) into regrown layer 16. The entirety of the surface of regrown layer 16 that is not covered by mask 34 is thus implanted to create a highly doped contact region, whereas the mesa region and regrown layers are of high resistivity. The portions of the regrown layer that are implanted are denoted in FIG. 6 and characterized as source 18 and drain 20. The portions of the regrown layer directly under mask 34 that do not have ions implanted therein are denoted as layer 16 in FIG. 6.

Figure 7:
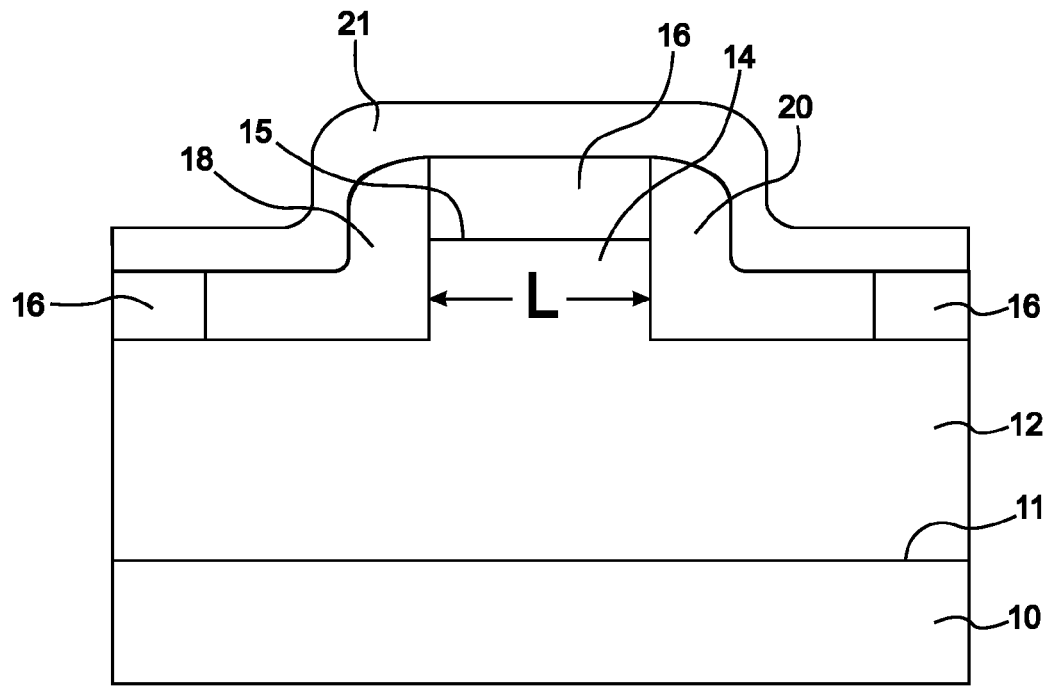

Thereafter, layer 21 of 3C polytype is grown on the entirety of the structure, as illustrated in FIG. 7. Layer 21 may have a thickness substantially less than about 1 micrometer and is grown at a temperature substantially lower than for hexagonal SiC, typically in the range 1200-1400° C. As shown in FIG. 7, layer 21 of 3C polytype is formed on source 18, drain 20, on regrown layer 16 over the top surface of the narrow mesa region 14, and on the portions of regrown layer 16 located at the peripheral of source 18 and drain 20.

Figure 8:
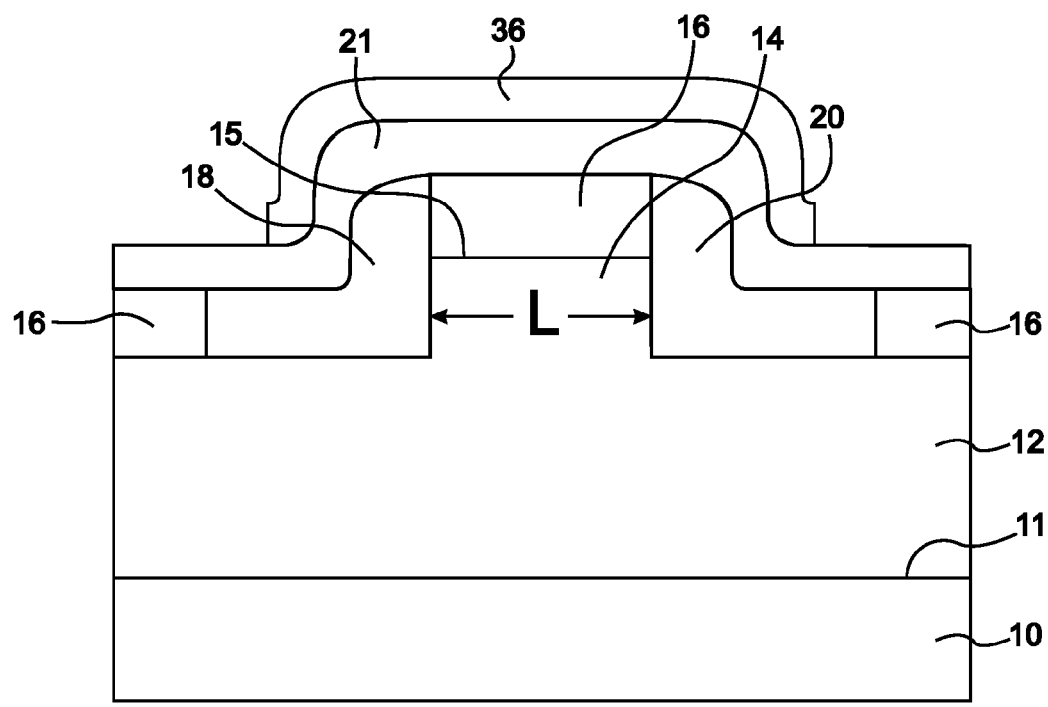

Thereafter, as shown in FIG. 8, mask 36 is formed on 3C polytype layer 21 above the channel between source 18 and 20, and over the sidewalls of the mesa structure. Mask 36 may be silicon dioxide or photo-resist, and may be formed using standard patterning and photolithography techniques. Layer 21 of 3C polytype is etched using typical Reactive Ion Etch (RIE) parameters with etch gases such $SF_6$, $CF_4$ etc. Mask 36 is subsequently removed.

Figure 9:
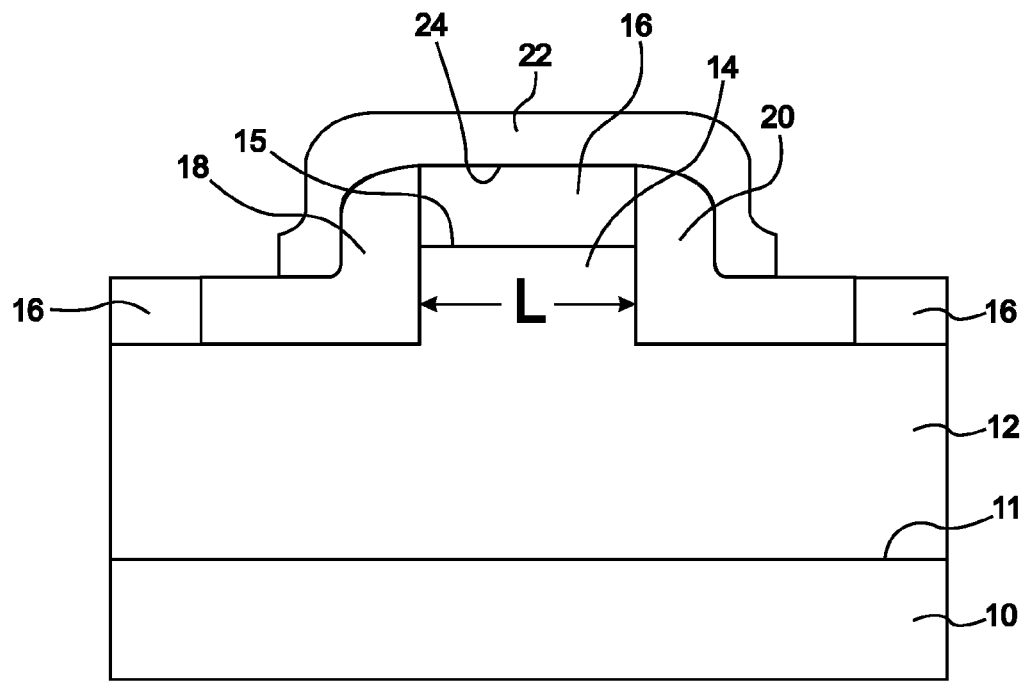

The resulting structure in FIG. 9 is shown after removal of mask 36, wherein portions of layer 21 of 3C polytype shown in FIG. 8 have been etched away and removed from the structure except for the region underlying mask 36, and wherein the remaining 3C polytype is denoted and characterized in FIG. 9 as second layer 22. Metal contacts 26, 28 and 30 are subsequently respectively formed on source 18, drain 20 and second layer 22 using standard processing techniques, to complete the device as shown in FIG. 1.

Returning to FIG. 7, during growth of layer 21 of 3C polytype on regrown layer 16 above the top surface of the mesa structure, crystal growth is confined by the physical dimensions of regrown layer 16 as limited by underlying narrow mesa region 14. Accordingly, the portion of second layer 22 in FIGS. 1 and 9 above hetero-interface 24 is substantially a single domain of crystal. In contrast, growth of 3C polytype layer 21 as described with respect to FIG. 7, over source 18 and drain 20, and on the regrown layer 16 at locations peripheral of source 18 and drain 20, is not confined, and thus includes many crystal domains as grown from a large plurality of nucleation sites. However, these portions of layer 21 are not over the channel region and do not contribute to the formation of the 2DEG at hetero-interface 24, and thus do not affect device operation.

In the embodiment described with respect to FIG. 1, first layer 12 is described as either 4H or 6H polytype, and second layer 22 is described as 3C polytype. However, first layer 12 is not necessarily limited as 4H or 6H polytype, but may in the alternative be 15R (rhombohedral) polytype. A 15R polytype may be grown on off-axis substrate 10 by appropriate choice of the MOCVD growth parameters. Moreover, in the case that first layer 12 is a 4H polytype, second layer 22 may be a 6H polytype. Alternatively, in the case that first layer 12 is a 6H polytype, second layer 22 may be 15R polytype.

In the first embodiment, impurities may be implanted into one of regrown layer 16 and second layer 22 to form the 2DEG at the hetero-interface 24 between regrown layer 16 and second layer 22. In general, regrown layer 16 and second layer 22 will have different bandgaps. For example, a 3C polytype of silicon carbide has a bandgap of about 2.3 eV, a 4H polytype of silicon carbide has a bandgap of about 3.2 eV, a 6H polytpe of silicon carbide has a bandgap of about 2.8 eV and a 15R polytype of silicon carbide has a bandgap of about 3 eV. During formation of the device structure such as shown in FIG. 1, the particular one of regrown layer 16 and second layer 22 having larger bandgap is implanted with impurities during device manufacture. For example, in the case where regrown layer 16 is 4H polytype and second layer 22 is 3C polytype, regrown layer 16 of 4H polytype having larger bandgap may have nitrogen or phosphorous implanted therein as n-type dopants at a dopant concentration in a range of about $10^{17}$ cm$^{-3}$. This impurity implantation may be performed after formation of regrown layer 16 as described with reference to FIG. 4. The charge of the dopants in regrown layer 16 would then fall into second layer 22 of 3C polytype. This would add charge to form the 2DEG at hetero-interface 24 between regrown layer 16 and second layer 22. By changing the amount and type of dopant, the characteristics of the 2DEG may be changed. In particular, the threshold of the 2DEG may be varied as desired. This enables tailoring of the 2DEG to provide a structure having desired characteristics.

In a further extension of the first embodiment, the fact that silicon carbide is a piezoelectric material is exploited. In general, when a material is strained, a potential difference will exist across the crystal of the material. When 3C polytype is grown on 4H polytype for instance, because the polytypes do not have exactly the same lattice constant, in other words because the crystal structure is not exactly the same, the crystal of the different polytypes do not fit exactly together. A strain in the layers thus occurs, resulting in a potential difference across the material whereby electric charge consequently accumulates at the hetero-interface between the different polytypes.

For instance, with reference to the embodiment of FIG. 1, the thickness of second layer 22 of 3C polytype can be selected to control the amount of strain thereof, and consequently the amount of charge that accumulates at the hetero-interface 24 between second layer 22 of 3C polytype and regrown layer 16 of 4C polytype. The thicker second layer 22, the greater the strain across the layer, thus resulting in providing greater charge to the 2DEG at hetero-interface 24 between second layer 22 and regrown layer 16. Performance of the 2DEG can thus be optimized as desired by selecting the thickness of the polytypes.

In a still further extension of the first embodiment, second layer 22 as described with respect to FIG. 1 can be grown on either the Si (silicon) face or the C (carbon) face of regrown layer 16, which in this case is silicon carbide. In general and as would be understood by one of ordinary skill, the crystal structure of silicon carbide has different orientations. The most common orientation of silicon carbide in wafer form is one in which the silicon atoms of the silicon-carbon bonds face upward. This face is referred to as the Si-face of the silicon carbide. In contrast, if the carbon atoms of the silicon-carbon bonds face upward, the face is referred to as the C-face of the silicon carbide. Different orientations of crystal affect the polarity of the potential difference across the material when strained. If for instance second layer 22 of 3C polytype is grown on the C-face of regrown layer 16 of 4H polytype in the embodiment described with respect to FIG. 1, the accumulated charge at hetero-interface 24 would be electrons. That is, an electron gas would be created. In the alternative, if second layer 22 of 3C polytype is grown on the Si-face of regrown layer 16 of 4H polytype, the accumulated charge at hetero-interface 24 would be holes instead of electrons. Thus, the device structure can be further tailored to meet particular needs by growing second layer 22 on either the Si-face or C-face of regrown layer 16.

Figure 10:
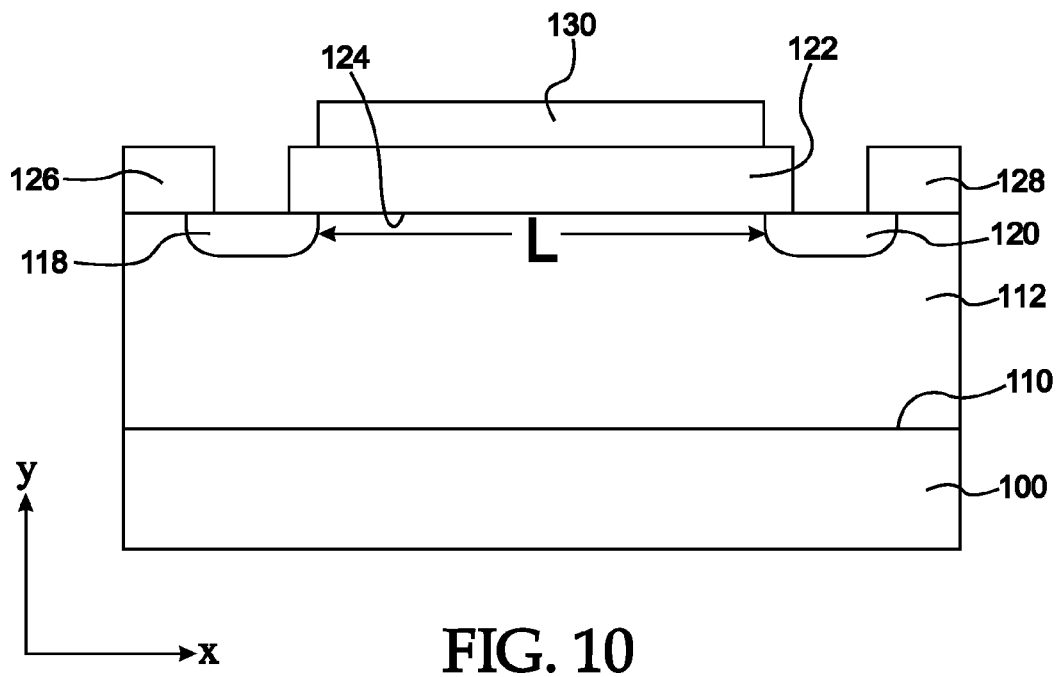
FIG. 10 illustrates a cross-section of a high electron mobility device of a second embodiment.

FIG. 10 illustrates a high electron mobility device of a further embodiment. As illustrated, the device includes a silicon carbide substrate 100 that is an off-axis substrate. As described previously, off-axis substrate 100 provides a well-defined starting point for subsequent crystal growth of an overlying 4H or 6H polytype of high quality. A first layer 112 of high quality silicon carbide of a first polytype 4H or 6H is grown on upper surface 110 of substrate 100. First layer 112 is an off-axis layer, and is grown in a similar manner as described with respect to FIGS. 1 and 2. Thereafter, source 118 and drain 120 are formed in a surface of first layer 112 by ion implantation of for example phosphorus or nitrogen, in a manner as would be well understood by one of ordinary skill. The channel region is formed between source 118 and drain 120, as having channel length L along an x-direction of less than about 10 microns, or about 5 microns, or more particularly in a range of about 3-4 microns. First layer 112 and substrate 110 may have respective thicknesses and characteristics as first layer 11 and substrate 10 as also described with respect to FIGS. 1 and 2.

As further illustrated in FIG. 10, second layer 122 is formed directly on the upper surface of first layer 112 over the channel region between source 118 and drain 120, and also overlaps slightly on source 118 and drain 120. Second layer 122 is grown at a low temperature in a range of about 1200°-1400° C. As described previously, the 3C polytype is the most favorable polytype for low temperature growth. Second layer 122 may have a thickness substantially less than 1 micrometer. Metal contacts 126, 128 and 130 are formed to source 118, drain 120 and second layer 122. Metal contacts 126, 128 and 130 may be Ni or Ti/Al, for example.

Figure 11:
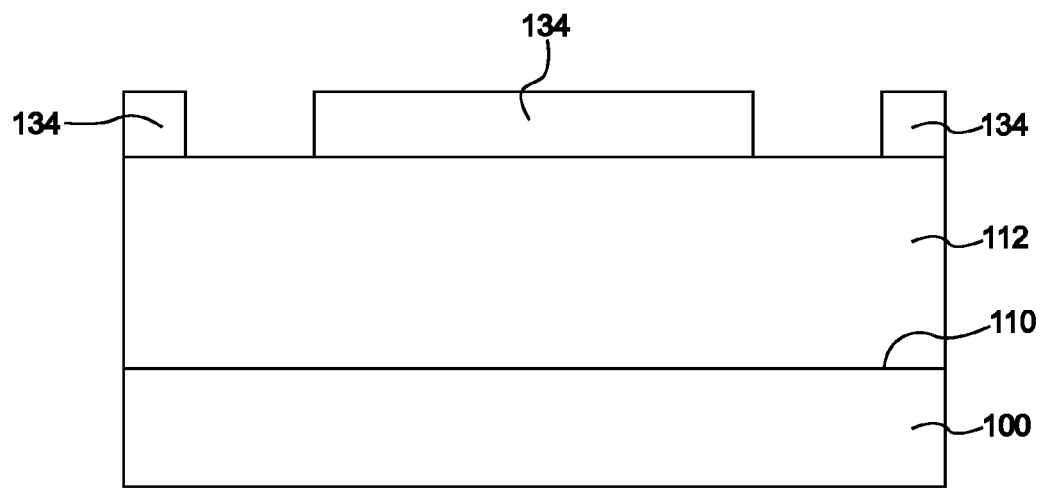
FIGS. 11-13 illustrate cross-sectional views descriptive of a process of making the device of FIG. 10.
Figure 12:
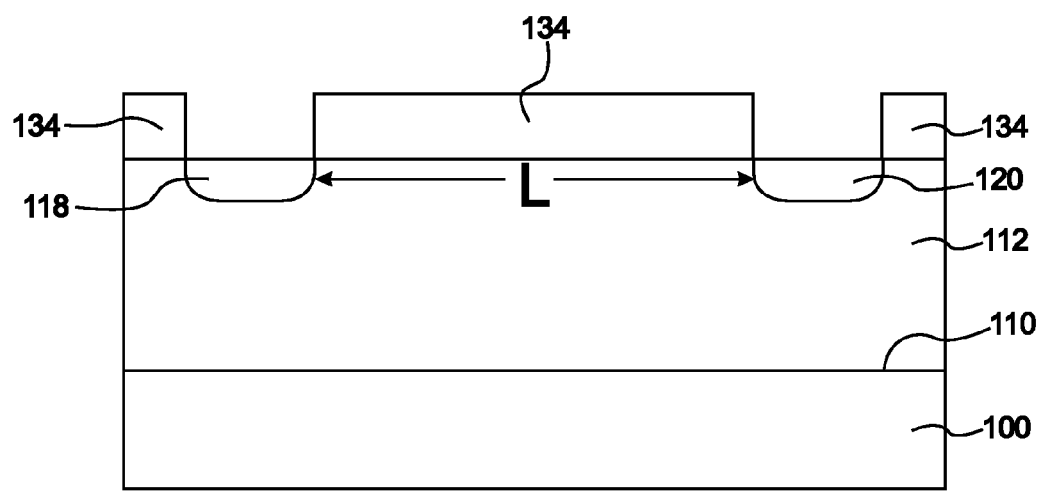
Figure 13:
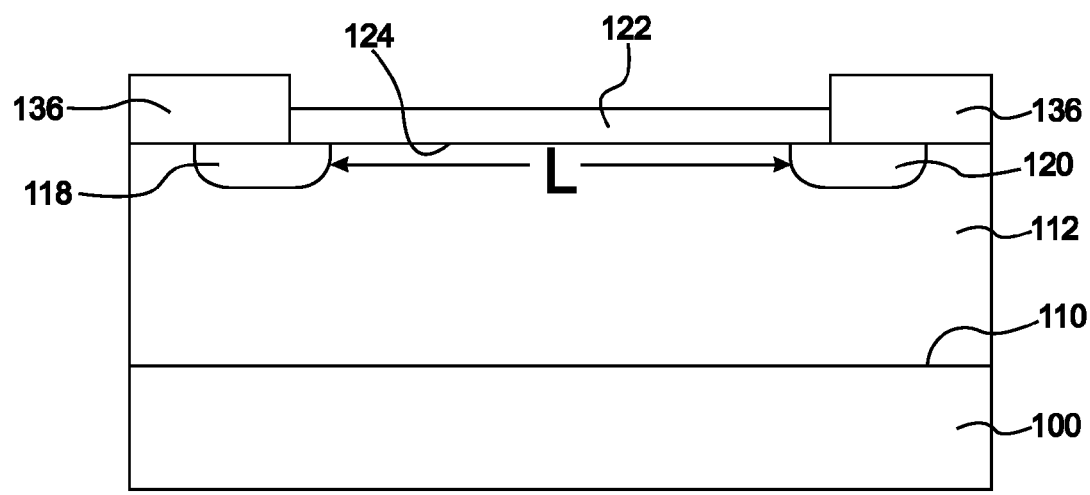

FIGS. 11-13 illustrate cross-sections of the structure descriptive of intermediate processing steps in connection with a method of making the device of FIG. 10. In FIG. 11, mask 134 is formed on the surface of first layer 112 using standard patterning and photolithography techniques, and exposes areas of the surface of first layer 112 where source 118 and drain 120 are to be implanted. Mask 134 is silicon dioxide or photoresist. FIG. 12 illustrates the structure after implantation of source 118 and drain 120 using mask 134. The surface of first layer 112 between source 118 and drain 120, that is the channel region, is shown in FIG. 12 as having channel length L.

Thereafter as shown in FIG. 13, mask 136 is formed on the upper surface of first layer 112, exposing the channel between source 118 and drain 120, and portions of source 118 and drain 120 adjacent the channel to provide alignment tolerance. The upper surface of first layer 112 located peripheral of source 118 and drain 120, and remaining portions of source 118 and drain 120, are covered by mask 136. Mask 136 is preferably silicon dioxide. Low temperature growth of 3C polytype is carried out using mask 136 to form second layer 122 on the surface of first layer 112 along the channel region. As noted above, second layer 122 overlaps slightly on source 118 and drain 120. The 3C polytype however does not grow significantly on mask 136. Any 3C polytype that inadvertently sticks to mask 136 is subsequently removed during removal of mask 136. Mask 136 may be removed using a standard HF solution for example. Subsequent removal of mask 136, metal contacts 126, 128 and 130 are formed, as shown in FIG. 10. It should be understood that in the case that mask 136 is silicon dioxide, this embodiment is primarily intended for growth of second layer 122 of 3C polytype, because a mask made of silicon dioxide would deteriorate at high temperatures necessary for growth of 4H, 6H and 15R polytypes.

The channel length between source 118 and drain 120 is selected as noted above to be at least less than about 10 microns. Mask 136 as formed on the upper surface of the structure as shown in FIG. 13 thus confines the growth of second layer 122 of 3C polytype, so that substantially a single crystal domain of 3C polytype is grown over the channel region between source 118 and drain 120. As described previously, since second layer 122 is substantially a single crystal domain of 3C polytype, grain boundary conduction is reduced, thus reducing electron leakage and enabling improved performance of the 2DEG formed at hetero-interface 124 between first layer 112 and second layer 122.

It should be understood that the extensions of the first embodiment as variously described with respect to FIG. 1 are also applicable to the embodiment described with respect to FIGS. 10-13. In general, impurities may be implanted into the one of first layer 112 and second layer 122 having larger bandgap to form the 2DEG at hetero-interface 124. The piezoelectric nature of silicon carbide may be exploited by selecting the thickness of layer 122 to control strain, and consequently the amount of charge that accumulates at hetero-interface 124. Also, second layer 122 may be grown on either the Si-face or the C-face of first layer 112.

Also, the device of the embodiments have been described as including silicon carbide polytypes. The techniques should be equally applicable to other materials such as the cubic and hexagonal forms of GaN, or in other materials in which it is not possible or feasible to form ternary alloys that allow bandgap engineering necessary to create a hetero-junction. These various changes and modifications of the preferred embodiments, and any other that would become apparent to those of ordinary skill, should be considered within the spirit and scope of the invention.

What is claimed is:

1. A high electron mobility device comprising:
    a substrate of semiconductor material;
    a first layer of a first polytype of the semiconductor material on the substrate, the first layer being an off-axis layer and having a narrow mesa region that extends from a first main surface of the first layer;
    a regrown layer of the first polytype over the narrow mesa region, the regrown layer having an on-axis surface over a top surface of the narrow mesa region;
    a source region in the regrown layer over a first sidewall of the narrow mesa region;
    a drain region in the regrown layer over a second sidewall of the narrow mesa region; and
    a second layer of a second polytype of the semiconductor material on the regrown layer, wherein a hetero-interface is formed between the regrown layer and the second layer over the top surface of the narrow mesa region,
    wherein the second layer over the top surface of the narrow mesa region is substantially a single crystal domain of the second polytype.

2. The high electron mobility device of claim 1, wherein the semiconductor material is silicon carbide.

3. The high electron mobility device of claim 2, wherein the second layer is on an Si-face of the regrown layer.

4. The high electron mobility device of claim 2, wherein the second layer is on a C-face of the regrown layer.

5. The high electron mobility device of claim 1, wherein the first polytype has a bandgap and the second polytype has a bandgap different than the bandgap of the first polytype, the polytype with the larger bandgap having impurities implanted therein.

6. The high electron mobility device of claim 1, wherein a thickness of the second layer is selected to provide a predetermined strain across the second layer, to supply desired piezocharge to the hetero-interface.

7. The high electron mobility device of claim 1, wherein the first polytype is 4H, and the second polytype is 3C.

8. The high electron mobility device of claim 1, wherein the first polytype is 6H, and the second polytype is 3C.

9. The high electron mobility device of claim 1, wherein the first polytype is 15R, and the second polytype is 3C.

10. The high electron mobility device of claim 1, wherein the first polytype is 4H, and the second polytype is one of 6H, 15R and 3C.

11. The electron mobility device of claim 1, wherein a channel length between the source region and the drain region is less than about 10 microns.

* * * * *